United States Patent
Cheng

(10) Patent No.: US 9,335,354 B2
(45) Date of Patent: May 10, 2016

(54) PHASE DETECTOR WITH METASTABLE PREVENTION STAGE

(71) Applicant: Silicon Motion Inc., Hsinchu County (TW)

(72) Inventor: Yu-Hsuan Cheng, New Taipei (TW)

(73) Assignee: Silicon Motion Inc., Taiyuan St., Jhubei, Hsinchu County (TW)

( * ) Notice: Subject to any disclaimer, the term of this patent is extended or adjusted under 35 U.S.C. 154(b) by 87 days.

(21) Appl. No.: 14/274,775

(22) Filed: May 12, 2014

(65) Prior Publication Data

US 2015/0185264 A1    Jul. 2, 2015

(30) Foreign Application Priority Data

Dec. 30, 2013 (TW) .............................. 102149103 A

(51) Int. Cl.
    *G01R 25/00* (2006.01)
    *H03D 13/00* (2006.01)
(52) U.S. Cl.
    CPC ................................... *G01R 25/005* (2013.01)

(58) Field of Classification Search
    CPC .......... H03D 13/004; H03K 5/26; H03L 7/95; H03L 7/891
    See application file for complete search history.

(56) References Cited

U.S. PATENT DOCUMENTS

| | | | | |
|---|---|---|---|---|
| 5,159,279 A | * | 10/1992 | Shenoi | H03L 7/095 326/52 |
| 5,297,173 A | * | 3/1994 | Hikmet | H04L 7/033 331/11 |
| 5,619,148 A | * | 4/1997 | Guo | H03D 13/004 327/10 |

* cited by examiner

Primary Examiner — Minh N Tang
(74) Attorney, Agent, or Firm — Winston Hsu; Scott Margo

(57) ABSTRACT

A phase detector, arranged for comparing a phase of a first clock with a phase of a second clock. The phase detector includes a phase detection stage and a metastable prevention stage. The phase detection stage is arranged to receive the first clock and the second clock, and to output a phase comparison result in accordance with the phase of the first clock and the phase of the second clock. The metastable prevention stage is arranged to receive the phase comparison result, and to output a stable phase comparison result in accordance with the phase comparison result.

10 Claims, 1 Drawing Sheet

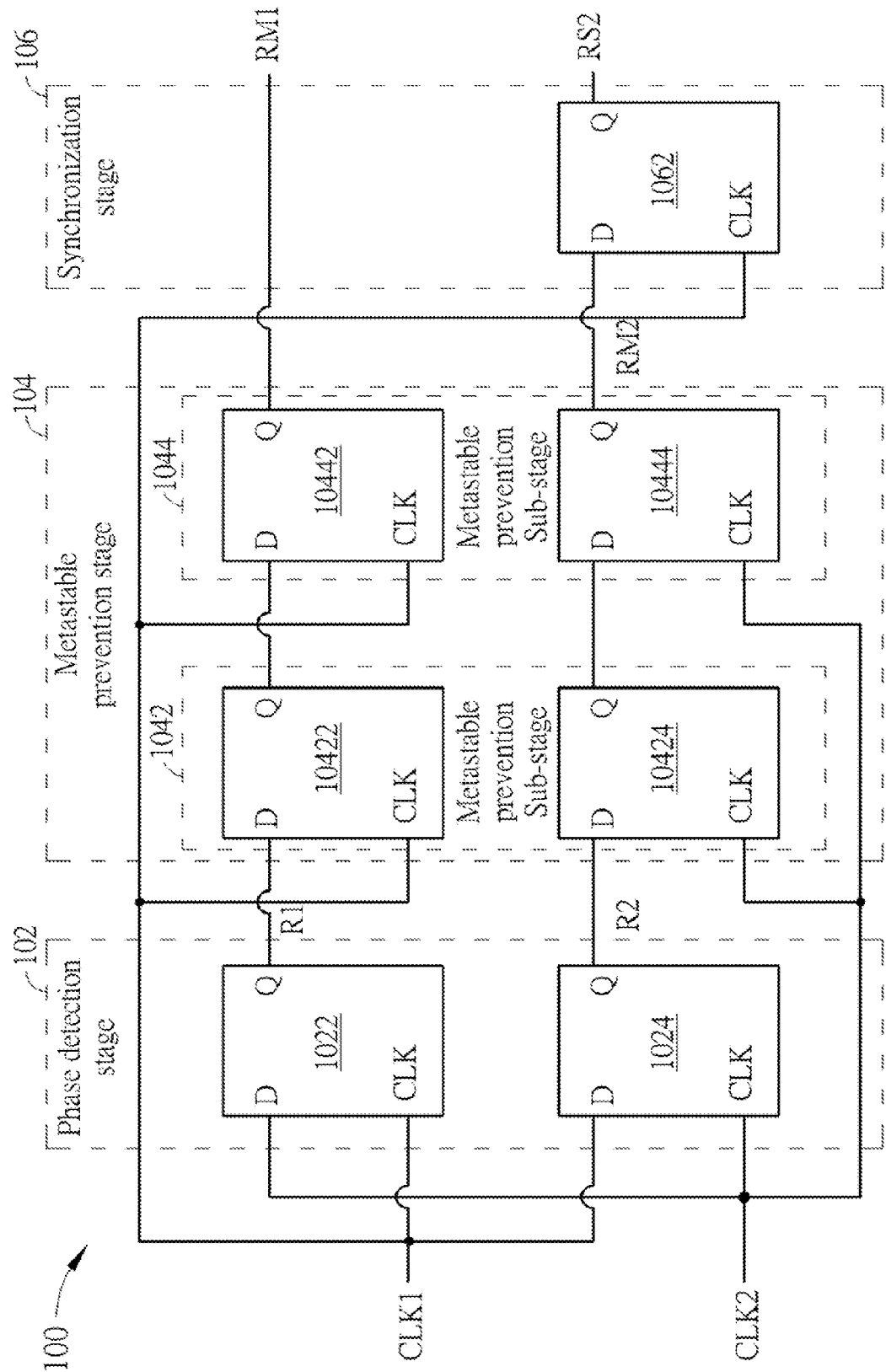

PHASE DETECTOR WITH METASTABLE PREVENTION STAGE

BACKGROUND OF THE INVENTION

1. Field of the Invention

The disclosed embodiments of the present invention relate to a phase detector, and more particularly, to a phase detector with a metastable prevention stage.

2. Description of the Prior Art

For integrated circuits (ICs), path delay of a path is due to a gate delay of each logic gate on the path and a wire delay of the overall wire routing. As IC processes continue to be scaled down, the wire width becomes more and more narrow, which leads to larger resistance. This larger resistance increases the path delay, which will affect signal transmission. Hence, clock skew is an issue which must be taken seriously by designers. In a double-data-rate static dynamic random access memory (SDRAM), if phases of internal signals have difficulties synchronizing with outside signals, the SDRAM will fail to capture data correctly.

A phase-locked loop (PLL) or a delay-locked loop (DLL) can be employed for solving this issue of clock and data synchronization. In both a PLL and a DLL, the most important component is the phase detector. Designers usually adopt circuits free from oscillation for detecting a signal phase to which the PLL/DLL is desired to lock, and then perform full custom design with respect to a specification and process. If the process or specification is changed, however, the current design has to be given up and the full custom design and verification flow must be performed again with respect to the updated process or specification.

In light of this, how to reduce complexity of a phase comparator without affecting the performance thereof has become an urgent issue in the field.

SUMMARY OF THE INVENTION

One of the objectives of the present invention is to provide a phase detector with a metastable prevention stage to solve the aforementioned issues.

According to an embodiment of the present invention, a phase detector is disclosed. The phase detector is arranged for comparing a phase of a first clock signal with a phase of a second clock signal, and comprises a phase detection stage and a metastable prevention stage. The phase detection stage is for receiving the first clock signal and the second clock signal, and outputting a phase detection result according to the phase of the first clock signal and the phase of the second clock signal. The metastable prevention stage is for receiving the phase detection result, and outputting a stable phase detection result according to the phase detection result.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The FIGURE is a diagram illustrating a phase detector according to an exemplary embodiment of the present invention.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

A phase detector applied for a delay-locked loop (DLL) (e.g. an all-digital DLL) is disclosed in this specification. The phase detector may be composed of a plurality of standard cells provided by a semiconductor manufacturer. A circuit layout of the phase detector may be generated by using an automated layout tool, and the circuit layout is free from metastable issues. Hence, problems that may be encountered in a conventional full custom design flows can be avoided, especially when the current process is updated or changed. The present invention may also be applied to a phase-locked loop (PLL) or a clock-and-data recovery (CDR).

The FIGURE is a diagram illustrating a phase detector 100 according to an exemplary embodiment of the present invention. The phase detector 100 is used for comparing a phase of a first clock signal CLK1 with a phase of a second clock signal CLK2, to generate a phase detector comparison result. Specifically, the comparison result is for indicating whether the phase of the first clock signal CLK1 is ahead of or behind the phase of the second clock signal CLK2. The phase detector 100 includes a phase detection stage 102, a metastable prevention stage 104 and a synchronization stage 106. The phase detection stage 102 is used for receiving the first clock signal CLK1 and the second clock signal CLK2, and generating a phase comparison result according to the phase of the first clock signal CLK1 and the phase of the second clock signal CLK2. The phase detection stage 102 includes a first flip-flop 1022 and a second flip-flop 1024, wherein the first flip-flop 1022 has a data input terminal D, a clock input terminal CLK and a data output terminal Q. The second clock signal CLK2 is inputted to the data input terminal D of the first flip-flop 1022 and the first clock signal CLK1 is inputted to the clock input terminal CLK of the first flip-flop 1022. The second flip-flop 1024 has a data input terminal D, a clock input terminal CLK and a data output terminal Q, wherein the first clock signal CLK1 is inputted to the data input terminal D of the second flip-flop 1024 and the second clock signal CLK2 is inputted to the clock input terminal CLK of the second flip-flop 1024. The phase comparison result includes a first comparison signal R1 outputted from the data output terminal Q of the first flip-flop 1022 and a second comparison signal R2 outputted from the data output terminal Q of the second flip-flop 1024.

The phase of the first clock signal CLK1 and the phase of the second clock signal CLK2 may be very close. This means that, for the first flip-flop 1022 and the second flip-flop 1024, the setup time and hold time violation is very likely to occur as a result of the metastable effect, which causes the first comparison signal R1 and the second comparison signal R2 to become unstable. To prevent this, the metastable prevention stage 104 is coupled to the first comparison signal R1 and the second comparison signal R2, and accordingly produces a stable phase comparison result. The metastable prevention stage 104 includes a metastable prevention sub-stage 1042 cascaded with a metastable prevention sub-stage 1044, wherein the metastable prevention sub-stage 1042 includes a first flip-flop 10422 and a second flip-flop 10424, and the metastable prevention sub-stage 1044 includes a third flip-flop 10442 and a fourth flip-flop 10444. It should be noted that the metastable prevention sub-stage is not limited to two stages, e.g. one stage is also possible. For advanced semiconductor manufacturing processes, two or more than two stages are more desirable. The connection scheme between the first flip-flop 10422, the second flip-flop 10424, the third flip-flop 10442 and the fourth flip-flop 10444 is shown in the FIGURE. The stable phase comparison result generated from the metastable prevention stage 104 includes a first stable comparison signal RM1 outputted from a data output terminal Q of the third flip-flop 10442 and a second stable comparison signal RM2 outputted from a data output terminal Q of the fourth flip-flop 10444.

The first stable comparison signal RM1 and the second stable comparison signal RM2 belong to a clock domain of the first clock signal CLK1 and a clock domain of the second clock signal CLK2, respectively. A synchronization stage 106 maybe used to synchronize the first stable comparison signal RM1 with the second stable comparison signal RM2. Specifically, the synchronization stage 106 uses a flip-flop 1062 to synchronize the second stable comparison signal RM2 with the clock domain of the first clock signal CLK1. The flip-flop 1062 includes a data input terminal D, a clock input terminal CLK and a data output terminal Q, wherein the data input terminal D receives the second stable comparison signal RM2, the clock input terminal CLK receives the first clock signal CLK1, and the data output terminal Q outputs a second synchronized stable comparison signal RS2 which is synchronized with the first stable comparison signal RM1.

The first stable comparison signal RM1 and the second synchronized stable comparison signal RS2 together comprise the above phase detector comparison result. The phase detector 100 can be applied to an all-digital DLL, which enables the DLL circuit to be designed completely by using standard cells provided by a semiconductor manufacturer. Further, a circuit layout can be implemented by using an automated layout tool. Please note that the embodiments disclosed in this specification may be applied to circuits other than a DLL. For instance, the phase detector 100 may be applied to a PLL or a CDR circuit. The flip-flops 1022, 1024, 10422, 10424, 10442, 10444 and 1062 shown in the FIGURE maybe any type of registers which can hold data and are clock-triggered, e.g. D-type flip-flops.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A phase detector, arranged for comparing a phase of a first clock signal with a phase of a second clock signal, comprising:
    a phase detection stage, for receiving the first clock signal and the second clock signal, and outputting a phase comparison result according to the phase of the first clock signal and the phase of the second clock signal; and
    a metastable prevention stage, for receiving the phase comparison result, and outputting a stable phase comparison result according to the phase comparison result;
    wherein the phase comparison result comprises a first comparison signal and a second comparison signal, and the metastable prevention stage comprises:
        a first flip-flop, having a data input terminal, a clock input terminal and a data output terminal, wherein the first comparison signal is inputted to the data input terminal of the first flip-flop, and the first clock signal is inputted to the clock input terminal of the first flip-flop; and
        a second flip-flop, having a data input terminal, a clock input terminal and a data output terminal, wherein the second comparison signal is inputted to the data input terminal of the second flip-flop, and the second clock signal is inputted to the clock input terminal of the second flip-flop;
    wherein the stable phase comparison result comprises a first stable comparison signal outputted from the data output terminal of the first flip-flop and a second stable comparison signal outputted from the data output terminal of the second flip-flop.

2. The phase detector of claim 1, wherein the phase detection stage and the metastable prevention stage is composed of standard cells provided by a semiconductor manufacturer and implemented by using an automated layout tool.

3. The phase detector of claim 1, wherein the phase detection stage comprises:
    a first flip-flop, having a data input terminal, a dock input terminal and a data output terminal, wherein the second clock signal is inputted to the data input terminal of the first flip-flop, and the first clock signal is inputted to the clock input terminal of the first flip-flop; and
    a second flip-flop, having a data input terminal, a clock input terminal and a data output terminal, wherein the first clock signal is inputted to the data input terminal of the second flip-flop, and the second dock signal is inputted to the dock input terminal of the second flip-flop;
    wherein the phase comparison result comprises a first comparison signal outputted from the data output terminal of the first flip-flop and a second comparison signal outputted from the data output terminal of the second flip-flop.

4. The phase detector of claim 1, wherein the stable phase comparison result comprises a first stable comparison signal and a second stable comparison signal. and the phase detector further comprises:
    a synchronization stage, for synchronizing the first stable comparison signal with the second stable comparison signal.

5. The phase detector of claim 4, wherein the synchronization stage is composed of standard cells provided by a semiconductor manufacturer and implemented by using an automated layout tool.

6. The phase detector of claim 4, wherein the synchronization stage comprises:
    a flip-flop, having a data input terminal, a clock input terminal and a data output terminal, wherein the data input terminal receives the second stable comparison signal, the clock input signal receives the first clock signal, and the data output terminal outputs a second synchronized stable comparison signal which is synchronized with the first stable comparison signal.

7. The phase detector of claim 1, wherein the phase detector is applied in a delay-locked loop (DLL).

8. The phase detector of claim 1, wherein the phase detector is applied in a phase-locked loop (PLL).

9. The phase detector of claim 1, wherein the phase detector is applied in a clock-and-data recovery (CDR) circuit.

10. A phase detector, arranged for comparing a phase of a first clock, signal with a phase of a second clock signal, comprising:
    a phase detection stage, for receiving the first clock signal and the second clock signal, and outputting a phase comparison result according to the phase of the first clock signal and the phase of the second clock signal; and a metastable prevention stage, for receiving the phase comparison result, and outputting a stable phase comparison result according to the phase comparison result;

wherein the stable phase comparison result comprises a first stable comparison signal and a second stable comparison signal, and the phase detector further comprises:

a synchronization stage, for synchronizing the first stable comparison signal with the second stable comparison signal, and comprising:

a flip-flop, having a data input terminal, a clock input terminal and a data output terminal, wherein the data input terminal receives the second stable comparison signal, the clock input signal receives the first clock signal, and the data output terminal outputs a second synchronized stable comparison signal which is synchronized with the first stable comparison signal.

* * * * *